(12) United States Patent
Hashimoto et al.

(10) Patent No.: US 8,643,102 B2
(45) Date of Patent: Feb. 4, 2014

(54) CONTROL DEVICE OF SEMICONDUCTOR DEVICE

(75) Inventors: Takayuki Hashimoto, Tokai (JP); Masahiro Masunaga, Hitachi (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 63 days.

(21) Appl. No.: 13/229,675

(22) Filed: Sep. 10, 2011

(65) Prior Publication Data

US 2012/0061722 A1    Mar. 15, 2012

(30) Foreign Application Priority Data

Sep. 10, 2010 (JP) ................................. 2010-202732
Mar. 31, 2011 (JP) ................................... 2011-77681

(51) Int. Cl.
*H01L 29/66* (2006.01)

(52) U.S. Cl.
USPC ...... 257/340; 257/341; 257/342; 257/E29.201

(58) Field of Classification Search
USPC .................. 257/E29.255, 340–342, E29.201
See application file for complete search history.

(56) References Cited

U.S. PATENT DOCUMENTS

| | | |
|---|---|---|
| 2005/0029584 A1 | 2/2005 | Shiraishi et al. |
| 2005/0173758 A1* | 8/2005 | Peake et al. ................... 257/330 |
| 2007/0120194 A1 | 5/2007 | Shiraishi et al. |
| 2007/0221952 A1* | 9/2007 | Thorup et al. ................ 257/155 |
| 2008/0217684 A1 | 9/2008 | Hashimoto et al. |
| 2009/0212358 A1* | 8/2009 | Shiraishi et al. .............. 257/330 |
| 2010/0059797 A1* | 3/2010 | Ngai et al. .................... 257/255 |
| 2011/0163732 A1* | 7/2011 | Sapp et al. .................... 323/282 |

FOREIGN PATENT DOCUMENTS

| | | |
|---|---|---|
| JP | 57-141964 A | 9/1982 |
| JP | 6-283718 A | 10/1994 |
| JP | 2005-057050 A | 3/2005 |
| JP | 2008-218711 A | 9/2008 |

OTHER PUBLICATIONS

Jacky C. W. Ng et al., "A Novel Planar Power MOSFET With Laterally Uniform Body and Ion-Implanted JFET Region" IEEE Electron Device Letters, 2008, vol. 29, No. 4, pp. 375-377, Apr. 2008.
Yuancheng Ren et al., "Analysis of the Power Delivery Path from the 12V VR to the Microprocessor", Proc. IEEE APEC '04, 2004, vol. 1, pp. 285-291.
Xu et al., "Small Signal Modeling of a High Bandwidth Voltage Regulator Using Coupled Inductors", IEEE Trans. Power Electron., vol. 22, No. 2, pp. 399-406, Mar. 2007.
H. Esaki et al., "A 900 MHz 100 W VD-MOSFET with silicide gate self-aligned channel", Proc. IEEE IEDM '84, 1984, pp. 447-450.

* cited by examiner

*Primary Examiner* — Cheung Lee
*Assistant Examiner* — Jeremy Joy
(74) *Attorney, Agent, or Firm* — Miles & Stockbridge P.C.

(57) ABSTRACT

A control device of a semiconductor device is provided. The control device of a semiconductor device is capable of reducing both ON resistance and feedback capacitance in a hollow-gate type planar MOSFET to which a second gate electrode is provided or a trench MOSFET to which a second gate electrode is provided. In the control device controlling driving of a hollow-gate type planar MOSFET to which a second gate electrode is provided or a trench MOSFET to which a second gate electrode is provided, a signal of tuning ON or OFF is outputted to a gate electrode in a state of outputting a signal of turning OFF to the second gate electrode.

6 Claims, 8 Drawing Sheets

CONTROL DEVICE OF SEMICONDUCTOR DEVICE

CROSS-REFERENCE TO RELATED APPLICATION

The present application claims priorities from Japanese Patent Application No. 2010-202732 filed on Sep. 10, 2010, and Japanese Patent Application No. 2011-77681 filed on Mar. 31, 2011, the contents of which are hereby incorporated by reference into this application.

TECHNICAL FIELD OF THE INVENTION

The present invention relates to a control device of a semiconductor device for power conversion. More particularly, the present invention relates to reduction of loss in a power-supply device using a power MOSFET as a semiconductor device for power conversion.

BACKGROUND OF THE INVENTION

A trench MOSFET (Metal Oxide Semiconductor Field Effect Transistor) has been used as a non-isolated step-down switching power supply (hereinafter, called VR: Voltage Regulator) which supplies power to a CPU (Central Processor Unit) of a personal computer or a server (for example, see Japanese Patent Application Laid-Open Publication No. 2008-218711 (Patent Document 1) and Japanese Patent Application Laid-Open Publication No. 2005-57050 (Patent Document 2)).

The trench MOSFET has a smaller cell pitch than that of a planar MOSFET (for example, see J. Ng et al., "A Novel Planar Power MOSFET With Laterally Uniform Body and Ion-Implanted JFET Region", IEEE Electron Device Letter, 2008, vol. 29, no. 4, pp. 375-377, April 2008 (Non-Patent Document 1)) and thus has a large channel width Wg per unit area and there is an advantage as it can reduce ON resistance. However, there is a demerit of large feedback capacitance as it has a large facing area of a trench gate and a drain region.

In recent years, for achieving a higher current and a lower voltage of a CPU, the number of output capacitors, which are provided for suppressing voltage fluctuations of a CPU occurring when current consumption of the CPU is abruptly changed, has been increased and it causes increases in the size and cost of a VR.

It has been known that an improvement in switching frequency of a VR is effective to reduce the number of output capacitors (for example, Y. Ren et al., "Analysis of the power delivery path from the 12-V VR to the microprocessor", in Proc. IEEE APEC' 04, 2004, vol. 1, pp. 285-291 (Non-Patent Document 2) and M. Xu et al., "Small signal modeling of a high bandwidth voltage regulator using coupled inductor", IEEE Trans. Power Electron., vol. 22, no. 2, pp. 399-406, March 2007 (Non-Patent Document 3)).

A bottleneck in improving switching frequency is that temperature of a MOSFET exceeds an upper limit (for example, 150° C.) of usage temperature of the MOSFET due to loss occurring along with switching. Examples of the loss occurring upon switching are, as to a high-side MOSFET of a VR, turn-on loss, turn-off loss, and drive loss; and, as to a low-side MOSFET, there are conduction loss and recovery loss of a build-in diode, and drive loss. Among these examples of loss, the turn-on loss and turn-off loss of a high-side MOSFET account for a relatively large portion. Hereinafter, the turn-on loss and turn-off loss will be collectively called "switching loss".

To reduce the switching loss, a reduction in feedback capacitance of the MOSFET is effective. The reason is that the speed of switching becomes faster when the feedback capacitance is reduced, and thus the switching loss is reduced. The trench MOSFET essentially has a problem of large feedback capacitance and thus achieving a further improvement in switching frequency is difficult.

When the switching frequency of a VR is low (for example, about 300 kHz), a ratio of the conduction loss occupying loss of the VR is large. Thus, a trench MOSFET having a low ON resistance is advantageous. When the switching frequency is high (for example, 1 MHz or higher), the switching loss is dominant and a planar type MOSFET having a small feedback capacitance is advantageous.

As a structure capable of further reducing the feedback capacitance of the planar MOSFET, a structure (hollow-gate type gate planar MOSFET) in which a central portion of a gate electrode of a planar MOSFET is eliminated has been released (for example, see H. Esaki et al., "A 900 MHz 100 W VD-MOSFET with silicide gate self-aligned channel", in Proc. IEEE IEDM' 04, 1984, pp. 447-450 (Non-Patent Document 4)).

The hollow-gate type MOSFET has a smaller overlap of a gate region and a drain region as compared with conventional planar MOSFETs, and thus the feedback resistance can be largely reduced.

Meanwhile, although the hollow-gate type planar MOSFET has a feature of small feedback capacitance, there is a problem of a large ON resistance. It has been known as means of improving the large feedback resistance that a second gate electrode is provided between gate electrodes of the hollow-gate type MOSFET and a positive voltage is applied to the second gate electrode, thereby reducing the ON resistance (for example, see Japanese Patent Application Laid-Open Publication No. 57-141964 (Patent Document 3) and Japanese Patent Application Laid-Open Publication No. 6-283718 (Patent Document 4)).

SUMMARY OF THE INVENTION

Patent Documents 3 and 4 do not describe about a driving sequence of the gate electrode and the second gate electrode upon switching the hollow-gate type planar MOSFET to which the second gate electrode is provided, and also do not describe about loss related to the driving sequence of the gate electrode and the second gate electrode.

The inventors of the present invention have found out a problem in the hollow-gate type planar MOSFET, to which the second gate electrode is provided, that the switching loss is increased when switching by inputting a signal of turning ON or OFF to the gate electrode while a positive voltage is being applied to the second electrode, because the feedback capacitance is large.

Accordingly, a preferred aim of the present invention is to solve the problems in existing technology and to provide a control device of a semiconductor device capable of reducing both ON resistance and feedback capacitance in a hollow-gate type MOSFET to which a second gate electrode is provided.

Incidentally, while the present invention has been devised in the process of studying and developing the hollow-gate type planar MOSFET to which the second electrode is provided, the present invention is effective in reducing ON resistance and feedback capacitance also in a trench MOSFET to which a second gate electrode is provided under a gate electrode.

Therefore, in the embodiments described below, examples of using the present invention to both a planar MOSFET and a trench MOSFET will be described.

The above and other preferred aims and novel characteristics of the present invention will be apparent from the description of the present specification and the accompanying drawings.

The typical ones of the inventions disclosed in the present application will be briefly described as follows.

More specifically, a typical one of the inventions is a control device of a semiconductor device controlling driving of a semiconductor device having a first gate electrode and a second gate electrode, in which driving of the second gate electrode is controlled so that the second gate electrode is at a same potential as a source electrode when outputting a control signal of turning ON or OFF to the first gate electrode.

The effects obtained by typical aspects of the present invention will be briefly described below.

More specifically, effects obtained by typical aspects of the present invention are achievements of both a reduction of ON resistance and a reduction of feedback capacitance in a planar MOSFET or a trench MOSFET and it is effective in a reduction of loss of a power-supply device using the planar MOSFET or the trench MOSFET.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

Figure 1:
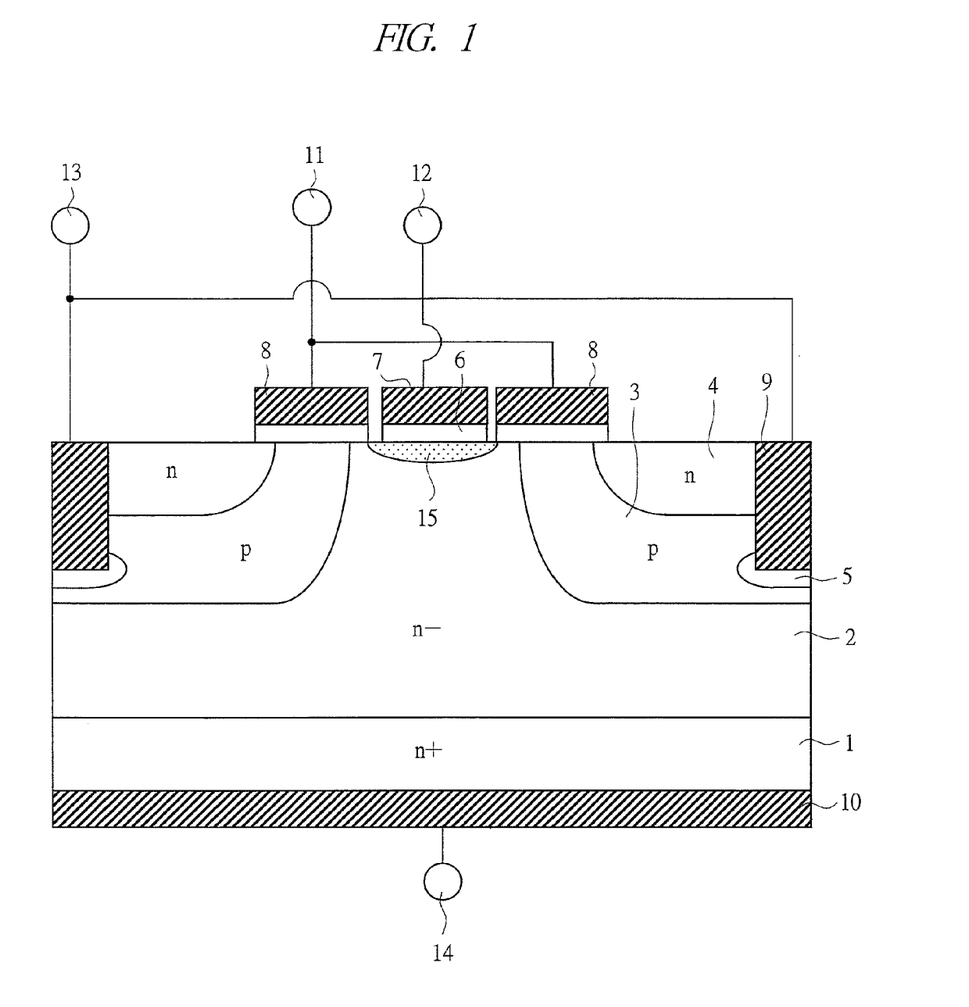
FIG. 1 is a configuration diagram of a semiconductor device controlled by a control device of a semiconductor device according to a first embodiment of the present invention.

With reference to FIG. 1, a configuration of a semiconductor device controlled by a control device of a semiconductor device according to a first embodiment of the present invention will be described. FIG. 1 is a configuration diagram illustrating a configuration of a semiconductor device to be controlled by the control device of a semiconductor device according to the first embodiment of the present invention. FIG. 1 illustrates a cross-sectional view of a hollow-gate type planar MOSFET to which a second gate electrode is provided.

In FIG. 1, 1 denotes an $n^+$-type substrate, 2 denotes an $n^-$-type substrate, 3 denotes a p-type well region, 4 denotes an n-type source region, 5 denotes a $p^+$-type contact region, 6 denotes an insulating film, 7 denotes a second gate electrode, 8 denotes a gate electrode, 9 denotes a source electrode, 10 denotes a drain electrode, 11 denotes a gate terminal, 12 denotes a second gate terminal, 13 denotes a source terminal, 14 denotes a drain terminal, and 15 denotes an electron accumulation layer.

When a positive voltage is applied to the gate electrode 8, a surface (channel) of the p-type well region 3 immediately under the gate electrode 8 is inverted to n-type, thereby letting a current to flow from the drain electrode 10 to the source electrode 9. Regarding the symbols "+" and "−" after "n" or "p", "+" means a high impurity concentration and "−" means a low impurity concentration.

When a positive voltage is applied to the second gate electrode 7, the electron accumulation layer 15 is generated in a surface of the $n^-$-type layer 2 immediately under the insulating film 6, thereby reducing an ON resistance.

Figure 2:
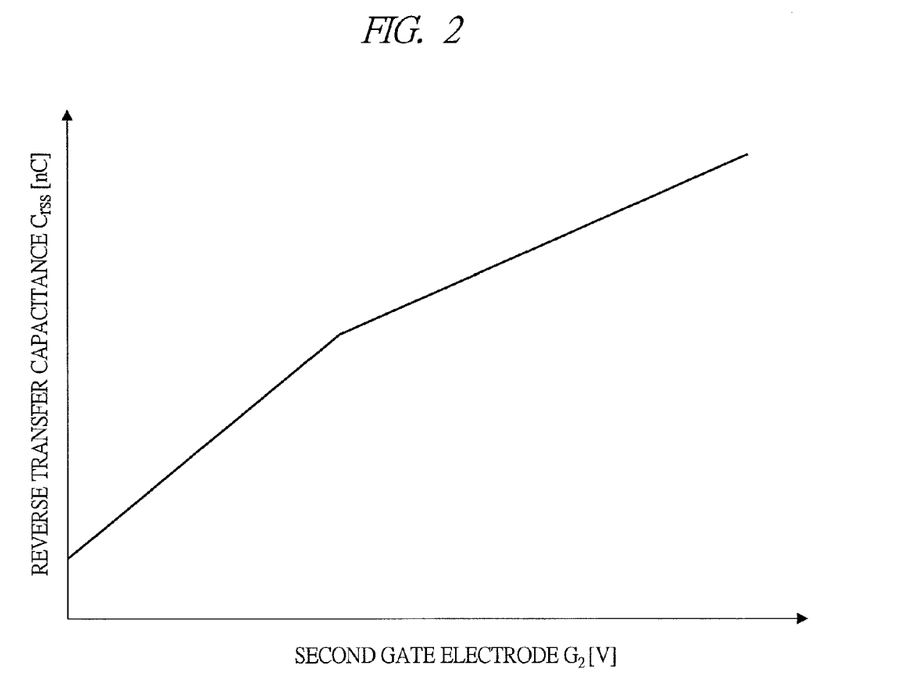
FIG. 2 is a diagram illustrating a relationship of a voltage applied to a second gate electrode of the control device of a semiconductor device and a feedback capacitance according to the first embodiment of the present invention.
Figure 3:
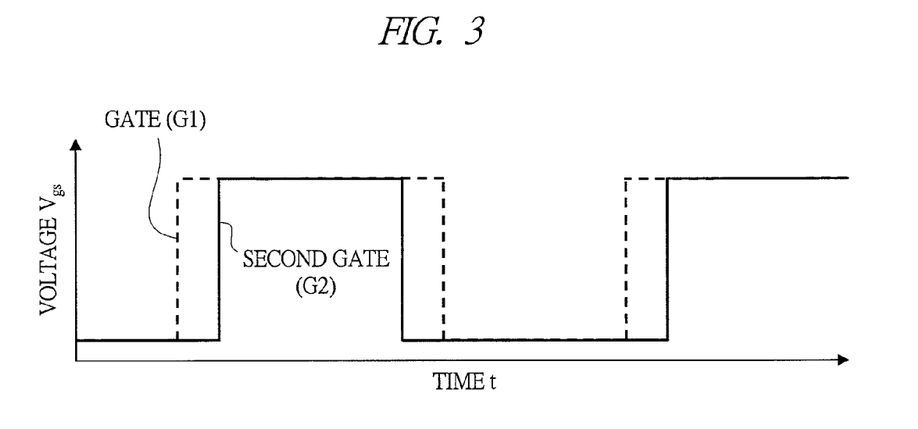
FIG. 3 is a diagram illustrating a driving sequence of a gate electrode and the second gate electrode of the control device of a semiconductor device according to the first embodiment of the present invention.

Next, with reference to FIGS. 2 and 3, a driving sequence of the gate electrode 8 and the second gate electrode 7 of the control device of a semiconductor device according to the first embodiment of the present invention will be described. FIG. 2 is a diagram illustrating a relationship of a voltage to be applied to the second gate electrode and a feedback capacitance of the control device of a semiconductor device according to the first embodiment of the present invention. FIG. 3 is a diagram illustrating a driving sequence of the gate electrode and the second gate electrode of the control device of a semiconductor device according to the first embodiment of the present invention.

Note that, regarding the control device of a semiconductor device, any configuration can be used as long as the control device is formed of a driver IC mounted on a multi-chip package, a control device which controls a semiconductor device for power conversion inside a power-supply device etc. together with a semiconductor device and as the gate electrode and the second gate electrode can be driven in accordance with the driving sequence illustrated in FIG. 3.

According to experiments by the inventors, it has been found out that the ON resistance is reduced by about 20% by applying a positive voltage to the second gate electrode 7 in the hollow-gate type planar MOSFET to which the second gate electrode is provided, the hollow-gate type MOSFET having a withstand voltage of 40V.

While reducing the feedback capacitance is effective for reducing the switching loss, the inventors have found out that there is a positive correlation between the applied voltage and the feedback capacitance of the second gate electrode 7 as illustrated in FIG. 2. That is, the larger the applied voltage to the second gate electrode 7 is, the more the feedback capacitance increases.

When a control signal of ON/OFF is inputted to the gate electrode 8 while a positive voltage is being applied to the second gate electrode 7, as the feedback capacitance is large, the switching loss is increased. Meanwhile, applying a positive voltage to the second gate electrode reduces the ON resistance, and thus conduction loss is reduced.

To reduce both the switching loss and conduction loss, it is effective when a zero voltage (same voltage as the source electrode) is applied to the second gate electrode 7 upon switching, and a positive voltage is applied to the second electrode 7 upon conduction.

Accordingly, in the present embodiment, the driving sequence as illustrated in FIG. 3 is used as a driving sequence of the gate electrode 8 and the second gate electrode 7 for achieving reduction of both the switching loss and conduction loss.

As illustrated in FIG. 3, upon turning ON, an input signal of turning ON is applied to the gate electrode 8 and the second gate electrode 7 in this order; and, upon turning OFF, an input signal of turning OFF is applied to the second electrode 7 and the gate electrode 8 in this order. By using such a driving sequence, a zero voltage (same voltage as the source electrode) is applied to the second gate electrode 7 upon switching, and a positive voltage is applied to the second gate electrode 7 upon conduction. In this manner, with achieving both a low ON resistance and a low feedback capacitance by controlling the second gate electrode 7 and the gate electrode 8, the conduction loss and switching loss of a VR can be reduced.

Second Embodiment

Figure 4:
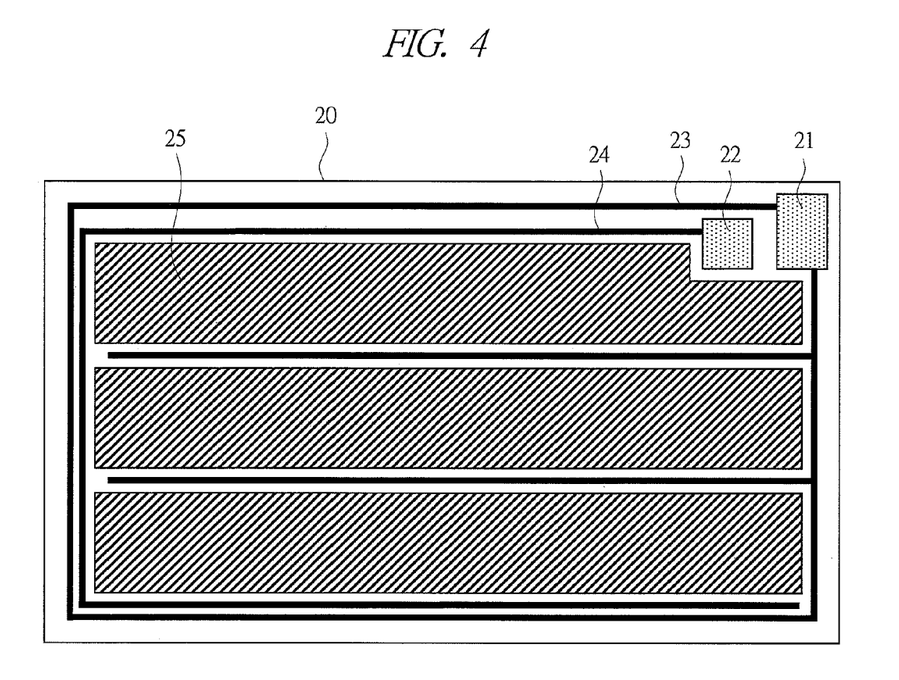
FIG. 4 is a configuration diagram illustrating a configuration of a semiconductor device controlled by a control device of a semiconductor device according to a second embodiment of the present invention.

With reference to FIG. 4, a configuration of a semiconductor device controlled by a control device of a semiconductor device according to a second embodiment of the present invention will be described. FIG. 4 is a configuration diagram illustrating a configuration of a semiconductor device to be controlled by the control device of a semiconductor device according to the second embodiment of the present invention. FIG. 4 illustrates a plan view of a chip of a hollow-gate type planar MOSFET to which a second gate electrode is provided or a trench MOSFET to which a second gate electrode is provided.

In FIG. 4, 20 denotes an outer circumference of the chip, 22 denotes a pad of the second gate electrode, 21 denotes a pad of a gate electrode, and 23 denotes a metal wiring of the gate electrode, the metal wiring being called "gate finger" (gate finger is described in Japanese Patent Application Laid-Open Publication No. 2004-55812, Japanese Patent Application Laid-Open Publication No. 2005-57050, etc.).

The reason of providing the gate finger is that the switching loss is reduced because lowering the gate resistance speeds up turning ON and turning OFF. 24 denotes a metal wiring of the second gate electrode, and 25 denotes a source electrode.

Since the source electrode 25 cannot be disposed in the region in which the metal wiring 22 of the gate electrode or the metal wiring 24 of the second gate electrode is provided, the spreading resistance of the source electrode 25 is increased and the ON resistance is thus increased.

A feature of the semiconductor device of the present embodiment is providing a larger number of wirings of the metal wiring 23 of the gate electrode than that of the metal wiring 24 of the second gate electrode (it may be said that a surface area of the metal wiring 23 of the gate electrode is large).

The resistance of the metal wiring 23 of the gate electrode has a strong correlation with the switching loss. Thus, to reduce the switching loss, the resistance of the metal wiring 24 is not important as the resistance of the metal wiring 23 because the resistance of the second gate electrode 24 has smaller influence to the switching loss while lowering the resistance of the metal wiring 23 is effective for lowering the switching loss.

However, also regarding the metal wiring 24 of the second gate electrode, if the resistance is too large (for example, 5Ω or more), the second gate electrode acts as if it is electrically floating, posing a through-current due to an increase in switching loss or false turn on (for example, see T. Hashimoto et al., "A system-in-Package (SiP) With Mounted Input Capacitors for Reduced Parasitic Inductances in a Voltage Regulator", IEEE Trans. Power Electron, vol. 25, no. 3, March 2010, pp. 731-740). Therefore, upon switching, it is preferable to make the resistance smaller than 5Ω.

In addition, the driving sequence of the gate electrode and the sense amplifier circuit via the pad 21 of the gate electrode and the pad 22 of the second gate electrode in the present embodiment is the same as the driving sequence of the first embodiment illustrated in FIG. 3.

In this manner, with achieving both a lower ON resistance and a lower feedback capacitance, conduction loss and switching loss of a VR can be reduced.

Third Embodiment

Figure 5:
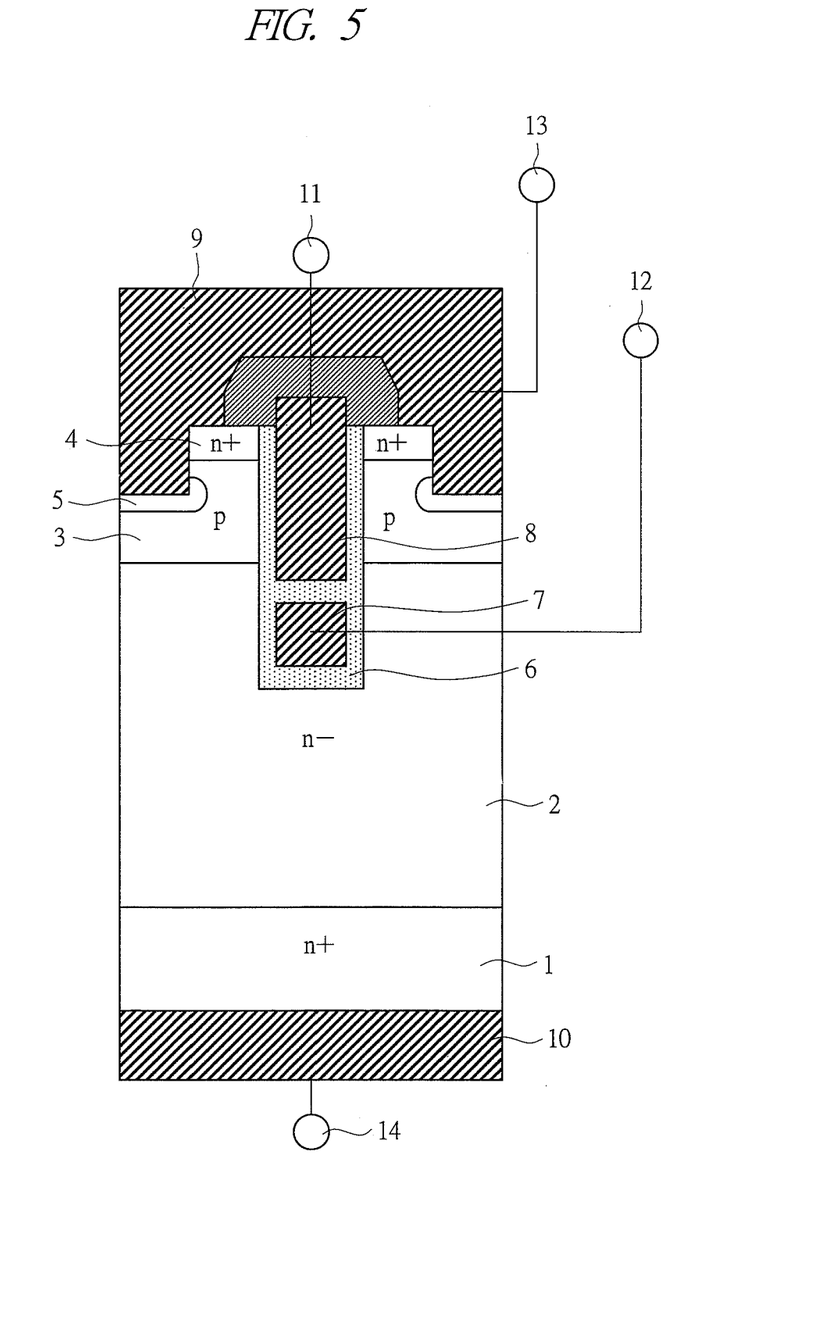
FIG. 5 is a configuration diagram illustrating a configuration of a semiconductor device controlled by a control device of a semiconductor device according to a third embodiment of the present invention.

With reference to FIG. 5, a configuration of a semiconductor device controlled by a control device of a semiconductor device according to a third embodiment of the present invention will be described. FIG. 5 is a configuration diagram illustrating a configuration of a semiconductor device to be controlled by the control device of a semiconductor device according to the third embodiment of the present invention. FIG. 5 illustrates a cross-sectional view of a trench MOSFET to which a second gate electrode is provided.

In FIG. 5, 1 denotes an n$^+$-type substrate, 2 denotes an n$^-$-type layer, 3 denotes a p-type well region, 4 denotes an n-type source region, 5 denotes a p$^+$-type contact region, 6 denotes an insulating film, 7 denotes a second gate electrode, 8 denotes a gate electrode, 9 denotes a source electrode, 10 denotes a drain electrode, 11 denotes a gate terminal, 12 denotes a second terminal, 13 denotes a source terminal, and 14 denotes a drain terminal.

While a structure in which the second gate electrode 7 is connected to a source terminal 13 has been generally known (for example, see P. Goarin et al., "Split-gate RESURF stepped oxide (RSO) MOSFET for 25 V applications with record low gate-to-drain charge", in Proc. IEEE ISPSD' 07, May 2007, pp. 61-64), the second gate electrode 7 is taken as the second gate terminal 12 being independent in the present embodiment.

When a positive voltage is applied to the gate electrode 8, the p-type well regions 3 (channel) on side surfaces of the gate electrode 8 are inverted, thereby flowing a current from the drain electrode 10 to the source electrode 9. When a positive voltage is applied to the second gate electrode 7, an electron accumulation layer is generated in the n$^-$-type layer 2 on a side surface of the second gate electrode 7, thereby reducing the ON resistance.

Also in the trench MOSFET according to the present embodiment, in the same manner as the planar MOSFET described in the first embodiment, by controlling the second gate electrode 7 and the gate electrode 8, both a lower ON resistance and a lower feedback capacitance can be achieved.

Fourth Embodiment

The hollow-gate type MOSFET and trench MOSFET both can reduce ON resistance and feedback capacitance by providing a second gate electrode 7. However, as the number of terminals is increased from 3, which has been previously used, to 4, there is a problem of more complex control.

To solve the problem, it is effective to mount a high-side MOSFET, a low-side MOSFET, and a drive IC driving these MOSFETs in one package (it is called "multi-chip package: for example, Japanese Patent Application Laid-Open Publication No. 2008-010851 etc. describe the multi-chip package).

By using the multi-chip package, users of the semiconductor device will not be aware of the number of MOSFET being four, and thus the complexity of the control is not a problem.

Figure 6:
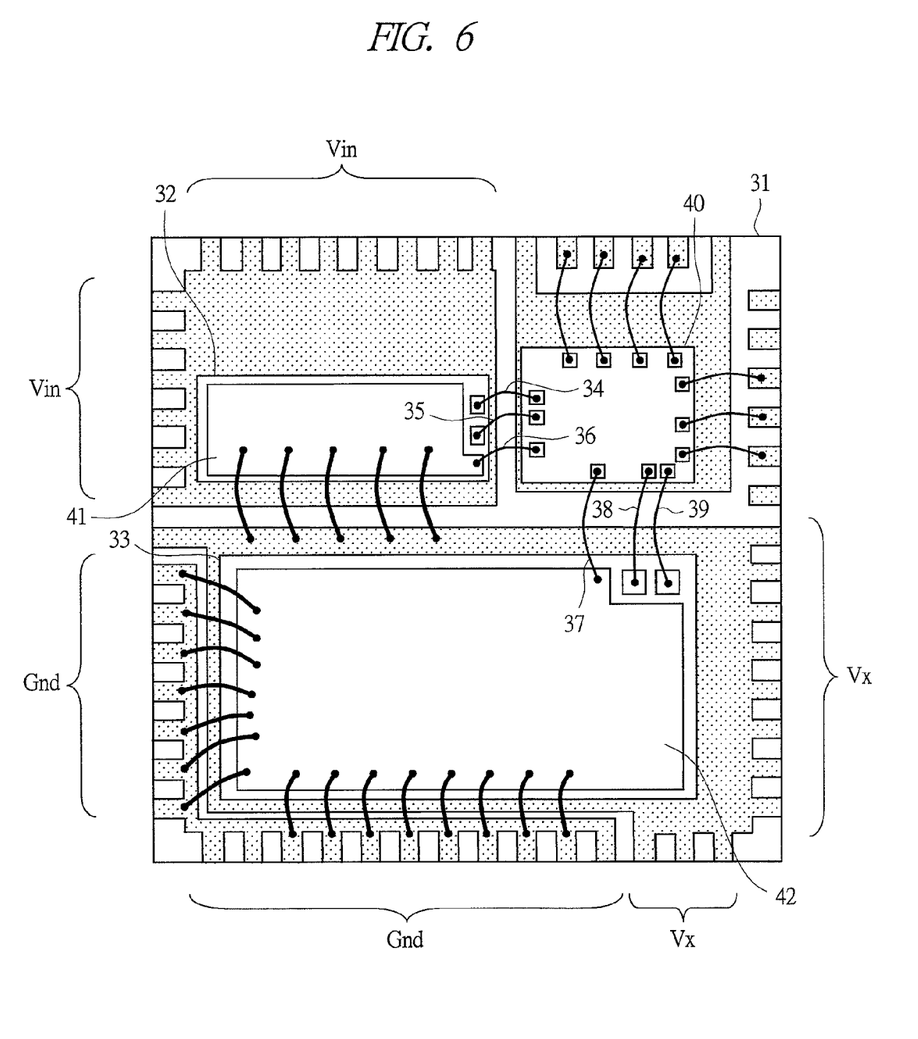
FIG. 6 is a configuration diagram illustrating a configuration of a multi chip package including a semiconductor device controlled by a control device of a semiconductor device according to a fourth embodiment of the present invention.

With reference to FIG. 6, a configuration of a multi-chip package including a semiconductor device controlled by a control device of a semiconductor device according to a fourth embodiment of the present invention will be described. FIG. 6 is a configuration diagram illustrating a configuration of the multi-chip package including a semiconductor device to be controlled by the control device of a semiconductor device according to the fourth embodiment of the present invention.

In FIG. 6, 31 denotes an outer circumference of the package, 32 denotes a high-side MOSFET, 33 denotes a low-side MOSFET, 40 denotes a driver IC, 34 denotes a wire connecting a second gate electrode of the high-side MOSFET 32 and the driver IC 40, 35 denotes a wire connecting a gate electrode of the high-side MOSFET 32 and the driver IC 40, 36 denotes a wire connecting a source electrode 41 of the high-side MOSFET 32 and the driver IC 40, 37 denotes a wire connecting a source electrode 42 of the low-side MOSFET 33 and the driver IC 40, 38 denotes a wire connecting a gate electrode of the low-side MOSFET 33 and the driver IC 40, and 39 denotes a wire connecting a second gate electrode of the low-side MOSFET 33 and the driver IC 40.

As illustrated in FIG. 6, by arranging the wire 35 connecting the gate electrode of the high-side MOSFET 32 and the driver IC 40 adjacent to the wire 36 connecting the source electrode 41 and the driver IC 40, magnetic fluxes generated from the wire 35 and wire 36 upon switching are cancelled, and thus parasitic inductance of a gate driving circuit can be reduced. Also, in the same manner, as to the wire 38 connecting the gate electrode of the low-side MOSFET 33 and the driver IC 40 and the wire 37 connecting the source electrode 42 and the driver IC 40, parasitic inductance of a gate driving circuit can be also reduced.

Fifth Embodiment

Using at least one or more of the driving sequences by the control devices of a semiconductor device according to the first to fourth embodiments to a high-side MOSFET or a low-side MOSFET of a VR (for example, see Non-Patent Documents 2 and 3 described above) can reduce loss of the VR.

As described in the foregoing, according to the present invention, both a lower ON resistance and a lower feedback capacitance can be achieved in a planar MOSFET or a trench MOSFET, and thus there is an effect of reducing loss of a power-source device in using the present invention.

Sixth Embodiment

A sixth embodiment is about performing either turning ON or OFF of the control of the gate electrode 8 and the second gate electrode 7 upon turning ON and control of the second gate electrode 7 and the gate electrode 8 upon turning OFF of the first embodiment.

Figure 7:
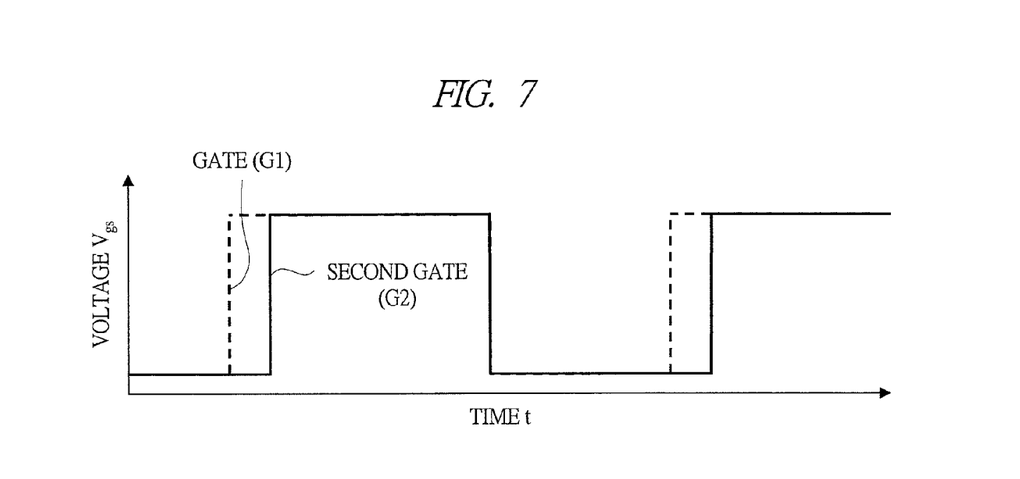
FIG. 7 is a diagram illustrating a driving sequence of a gate electrode and a second gate electrode of a control device of a semiconductor device according to a sixth embodiment of the present invention.
Figure 8:
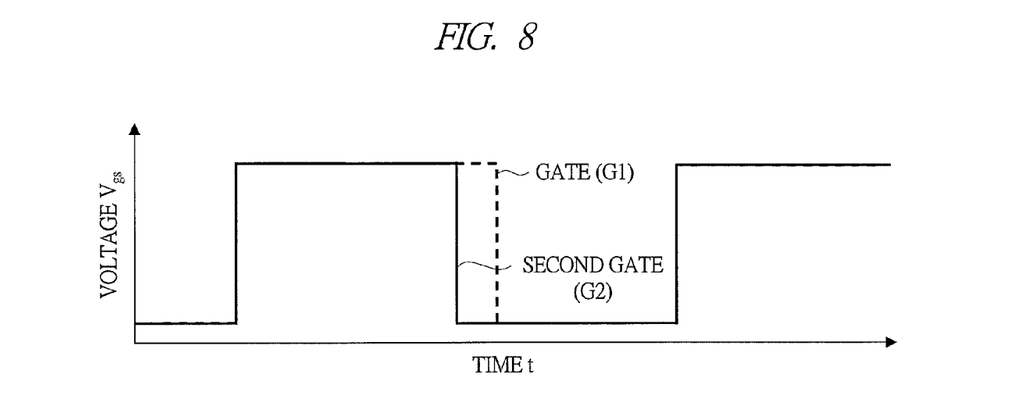
FIG. 8 is a diagram illustrating a driving sequence of the gate electrode and the second gate electrode of the control device of a semiconductor device according to the sixth embodiment of the present invention.

With reference to FIGS. 7 and 8, a driving sequence of a gate electrode 8 and a second gate electrode 7 of a control device of a semiconductor device according to the sixth embodiment of the present invention will be described. FIGS. 7 and 8 are diagrams illustrating driving sequences of the gate electrode and the second gate electrode of the control device of a semiconductor device according to the sixth embodiment of the present invention. FIG. 7 illustrates control of turning ON only, and FIG. 8 illustrates control of turning OFF only.

In the driving sequence illustrated in FIG. 7, control is performed so that an input signal is applied to the gate electrode 8 and the second gate electrode 7 in this order upon turning ON; and an input signal of turning OFF is applied simultaneously to the gate electrode 8 and the second gate electrode 7 upon turning OFF.

In this case, as compared with the first embodiment, the turn OFF loss is larger but the same effect as the first embodiment can be achieved.

In addition, in the driving sequence illustrated in FIG. 8, control is performed such that an input signal of turning ON is simultaneously applied to the gate electrode 8 and the second gate electrode 7 upon turning ON; and an input signal is applied to the second gate electrode 7 and the gate electrode 8 in this order upon turning OFF.

In this case, as compared with the first embodiment, the turning ON loss is larger but the same effect as the first embodiment can be achieved.

Seventh Embodiment

Figure 9:
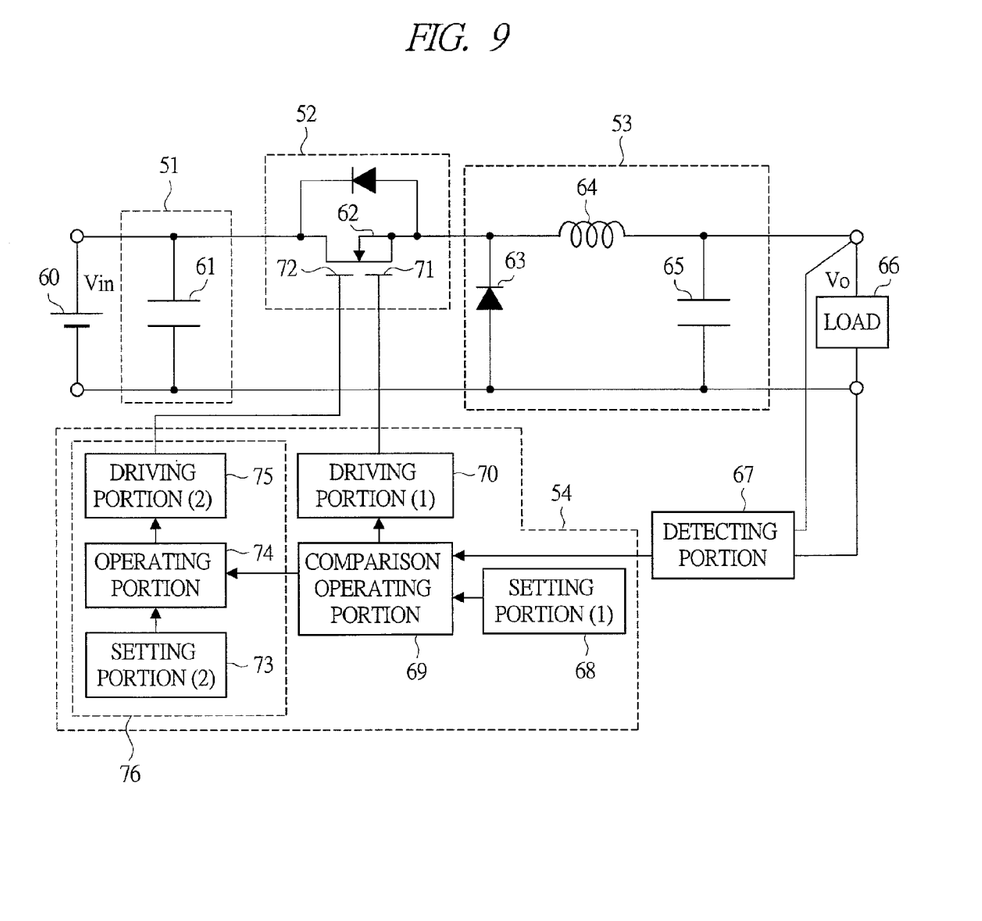
FIG. 9 is a configuration diagram illustrating a circuit configuration of a power supply including a control device of a semiconductor device according to a seventh embodiment of the present invention.

With reference to FIG. 9, a power supply including a control device of a semiconductor device according to a seventh embodiment of the present invention will be described. FIG. 9 is a configuration diagram illustrating a circuit configuration of the power supply including the control device of a semiconductor device according to the seventh embodiment of the present invention, the power supply including a circuit of controlling a gate and a second gate of a semiconductor device.

In FIG. 9, the power supply is formed of an input portion 51, a switching portion 52, an output portion 53, a control portion 54, and a detecting portion 67, in which a direct-current input power supply 60 is connected to the input portion 51, and a load 66 is connected to the output portion 53.

The input portion 51 is formed of a capacitor 61. The switching portion 52 is formed of a MOSFET 62. The output portion 53 is formed of an output filter formed of a freewheel diode 63, a choke coil 64, and a capacitor 65.

The control portion 54 is formed of a setting portion (1) 68, a comparison operating portion 69, a driving portion (1) 70, and a control potion (2) 76. Further, the control portion 54 includes an oscillating circuit, which is not illustrated, and outputs a pulse signal from the driving portion (1) 70 to the gate 71 of the MOSFET 62. In this manner, a direct-current voltage Vin from the direct-current input power supply 60 applied to the MOSFET 62 is switched.

When the MOSFET 62 is ON, direct-current power is charged into the choke coil 64 and the capacitor 65 and also supplied to the load 66. When the MOSFET 62 is OFF, energy having been charged in the choke coil 64 and the capacitor 65 is supplied to the load 66 via the freewheel diode 63.

Here, in the control portion 54, an output voltage Vo detected at the detecting portion 67 is monitored at the comparison operating portion 69, and thus detection and a control target value having been set in the setting portion (1) 68 are compared, and a control signal based on a result of the comparison is outputted from the driving portion (1) 70 to the switching portion 52.

In this manner, ON/OFF of the MOSFET 62 is controlled, and the power supplied to the load is controlled to be matched with the control target value. The output voltage Vo here is expressed by the Equation (1) below.

$$Vo = Vin \times (T_{ON}/T) \qquad (1)$$

Note that Vin denotes an input direct-current voltage 60, T denotes a cycle of a pulse signal outputted from the driving portion (1) 70, and $T_{ON}$ denotes a time period of conduction of the MOSFET 62 in the cycle T. That is, $T_{ON}/T$ denotes a duty ratio.

Meanwhile, on the freewheel diode side of the output portion 53, it is normal to use a diode which is a passive element as illustrated in FIG. 9. However, as the freewheel diode 63 has large loss upon current conduction, a MOSFET is used instead of the freewheel diode 63. Note that the present invention can be used regardless of using a freewheel diode or using a MOSFET.

Different points of the present embodiment from existing circuits are the MOSFET 62 having the second gate 72 in addition to the gate 71, and having the control portion (2) 76 driving the second gate 72.

The control portion (2) 76 is formed of a setting portion (2) 73, a computing portion 74, and a driving portion (2) 75. The setting portion (2) 73 sets time differences between rising edge and falling edge of the gate 71 and the second gate 72. The computing portion 74 receives a result of the computation of the comparative computing portion 69 and outputs a driving signal of the second gate 72 to the driving portion (2) 75 in accordance with an output from the setting portion (2) 73.

According to the control of driving the second gate 72 by the control portion (2) 76, driving in the same manner as the driving sequences to the gate electrode 8 and the second gate electrode 7 as described in the first and sixth embodiments are performed, and thus a power supply capable of reducing the conduction loss and switching loss can be provided.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention relates to control devices of a semiconductor device for power conversion, and widely applicable to power-supply devices using a power MOSFET as a semiconductor device.

What is claimed is:

1. A control device of a semiconductor device controlling driving of a semiconductor device, the control device comprising:
   a semiconductor substrate;
   a drain electrode formed on a rear surface of the semiconductor substrate;
   a plurality of well regions formed on a surface of the semiconductor substrate;
   a plurality of semiconductor regions formed on the surface of the semiconductor substrate in a region at a deeper position than the well regions and having a conductivity opposite to that of the well regions;
   a plurality of source regions formed in the well regions;
   a trench penetrating the source regions and the well regions and reaching a first semiconductor region;
   a gate insulating film formed on a side surface and a bottom surface of the trench;
   a first gate electrode formed on the gate insulating film;
   a source electrode electrically connected to the source region;
   a second gate electrode provided under the first gate electrode and connected to the first gate electrode and the first semiconductor region by an interposing insulating film portion;
   a first gate electrode pad electrically connected to the first gate electrode;
   a metal wiring electrically connected to the first gate electrode pad;
   a second gate electrode pad electrically connected to the second gate electrode; and
   a metal wiring electrically connected to the second gate electrode pad,
   wherein a surface area of the metal wiring electrically connected to the first gate electrode pad is larger than a surface area of the metal wiring electrically connected to the second gate electrode pad,
   wherein driving of the second gate electrode is controlled so that the second gate electrode is at a same potential as the source electrode when outputting a control signal of turning ON or OFF to the first gate electrode.

2. The control device of a semiconductor device according to claim 1,
   wherein a control signal of turning ON is outputted to the second gate electrode upon controlling driving of turning ON the semiconductor device, after outputting a control signal of turning ON to the first gate electrode.

3. The control device of a semiconductor device according to claim 1,
   wherein a control signal of turning OFF is outputted to the first gate electrode upon controlling driving of turning OFF the semiconductor device, after outputting a control signal of turning OFF to the second gate electrode.

4. The control device of a semiconductor device according to claim 1,
   wherein the control device of a semiconductor device is mounted on one package together with the semiconductor device.

5. The control device of a semiconductor device according to claim 4,
   wherein a conductor connecting the first gate electrode pad of the semiconductor device and the control device of a semiconductor device is arranged next to a conductor connecting the source electrode of the semiconductor device and the control device of a semiconductor device.

6. The control device of a semiconductor device according to claim 1,
   wherein the control device of a semiconductor device is mounted on a power supply device that complementally controls turning ON and OFF of a first semiconductor device and a second semiconductor device connected in series between a voltage input terminal and a reference potential terminal, and flows a current to an inductance element connected to connection nodes of the first semiconductor device and the second semiconductor device for outputting a voltage made by converting a voltage applied to the voltage input terminal, thereby controlling driving of the first semiconductor device and the second semiconductor device.

* * * * *